(12) United States Patent
Sheen et al.

(10) Patent No.: US 11,290,096 B2
(45) Date of Patent: Mar. 29, 2022

(54) SYSTEM AND METHOD FOR ADJUSTING CYCLE OF A SIGNAL

(71) Applicant: Taiwan Semiconductor Manufacturing Company Limited, Hsinchu (TW)

(72) Inventors: Ruey-Bin Sheen, Taichung (TW); Ming Hsien Tsai, New Taipei (TW); Tsung-Hsien Tsai, New Taipei (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 0 days.

(21) Appl. No.: 17/178,899

(22) Filed: Feb. 18, 2021

(65) Prior Publication Data

US 2021/0336613 A1 Oct. 28, 2021

Related U.S. Application Data

(63) Continuation of application No. 16/860,568, filed on Apr. 28, 2020, now Pat. No. 10,958,257.

(51) Int. Cl.
*H03K 5/156* (2006.01)
*G04F 10/00* (2006.01)
*H03K 3/017* (2006.01)
*H03K 5/06* (2006.01)

(52) U.S. Cl.
CPC ......... *H03K 5/1565* (2013.01); *G04F 10/005* (2013.01); *H03K 3/017* (2013.01); *H03K 5/06* (2013.01)

(58) Field of Classification Search
CPC ........ H03K 5/1565; H03K 3/017; H03K 5/06; G04F 10/005
USPC .......................................... 327/175
See application file for complete search history.

(56) References Cited

U.S. PATENT DOCUMENTS

| | | | | |
|---|---|---|---|---|
| 6,650,162 B2* | 11/2003 | Dubey | ............ | G06F 1/04 327/175 |
| 9,654,093 B2* | 5/2017 | Yun | ............ | H03K 7/08 |
| 11,031,927 B2* | 6/2021 | Sheen | ............ | H03K 5/131 |
| 2005/0057312 A1* | 3/2005 | Chang | ............ | H03L 7/06 331/16 |
| 2010/0182060 A1* | 7/2010 | Fujino | ............ | H03L 7/085 327/159 |

(Continued)

OTHER PUBLICATIONS

U.S. Appl. No. 16/733,379, filed Jan. 3, 2020, Taiwan Semiconductor Manufacturing Company Limited.

(Continued)

*Primary Examiner* — Ryan Jager
(74) *Attorney, Agent, or Firm* — Foley & Lardner LLP

(57) ABSTRACT

A duty cycle adjustment system includes a time-to-digital converter to generate a plurality of time-to-digital codes from an input signal, a duty cycle index generator to compute a duty cycle of the input signal based upon the plurality of time-to-digital codes, and assign a duty cycle index based upon the computed duty cycle, an input phase assignment generator to generate a first output and a second output based upon the duty cycle index, a first delay line to delay the first output to generate a third output, and a duty cycle generator to adjust the duty cycle of the input signal based upon the third output and the second output.

20 Claims, 11 Drawing Sheets

(56) References Cited

U.S. PATENT DOCUMENTS

| | | | | |
|---|---|---|---|---|
| 2011/0187907 A1* | 8/2011 | Takahashi | ............. | H03K 3/017 |
| | | | | 348/302 |
| 2013/0058437 A1* | 3/2013 | Oshima | ............. | H03M 1/0836 |
| | | | | 375/316 |
| 2015/0055415 A1* | 2/2015 | Yamamoto | ............. | G11C 16/32 |
| | | | | 365/185.18 |
| 2016/0105165 A1* | 4/2016 | Shim | .................... | G04F 10/005 |
| | | | | 327/175 |
| 2019/0268010 A1* | 8/2019 | Wu | ........................ | G04F 10/04 |
| 2020/0106597 A1* | 4/2020 | Hailu | ................... | H04L 7/0337 |

OTHER PUBLICATIONS

Mu, Fenghao et al. "Pulsewidth Control Loop in High-Speed CMOS Clock Buffers" IEEE Transactions on Solid State Circuits, vol. 35, No. 2, Feb. 2000 (IEEE 2000), pp. 134-141.

* cited by examiner

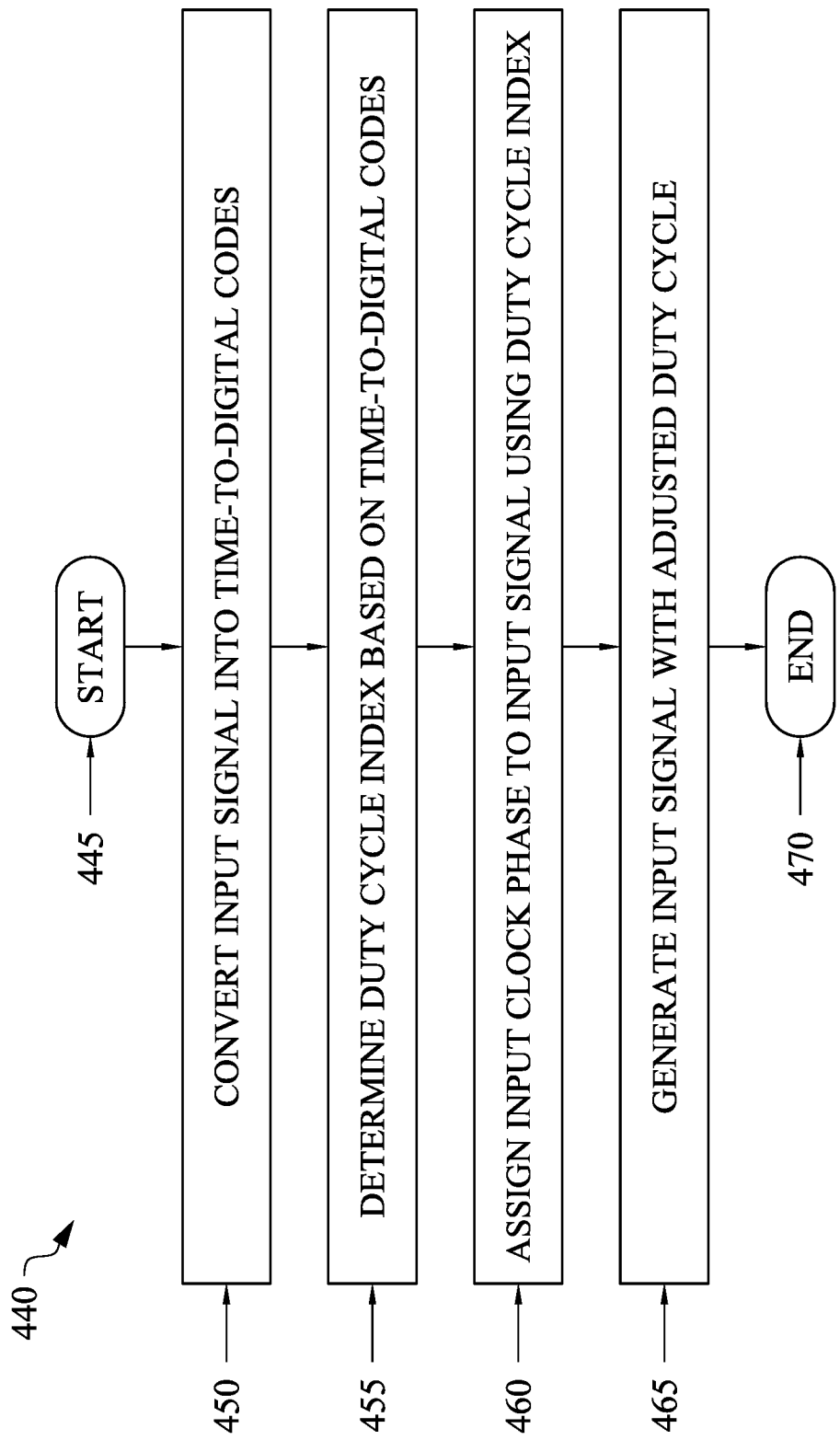

SYSTEM AND METHOD FOR ADJUSTING CYCLE OF A SIGNAL

CROSS-REFERENCE TO RELATED APPLICATIONS

This application is a continuation of U.S. patent application Ser. No. 16/860,568, filed on Apr. 28, 2020, the entirety of which is incorporated by reference herein.

BACKGROUND

Pulse signals are commonly used in digital circuits for a variety of purposes, such as signaling memory read/write times, indicating the occurrence of an event, providing timing synchronization, etc. Proper functioning of a circuit often requires that the pulse signals be of a designated width. Pulses that are not provided for a long enough time may result in incomplete downstream processes or may not be detected at all. Pulses that are provided for too long a time may result in erroneous downstream circuit operation (e.g., what was meant to be a single pulse may be interpreted as multiple pulses). As circuit sizes scale down and operation speeds increase, power and circuit area efficiency, including proper pulse generation, becomes important. However, present day mechanisms for pulse generation have limitations in the way they are configured.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is an example flowchart outlining operations for adjusting the duty cycle of an input signal using the duty cycle adjustment system of FIG. 1, in accordance with some embodiments.

DETAILED DESCRIPTION

Figure 1:
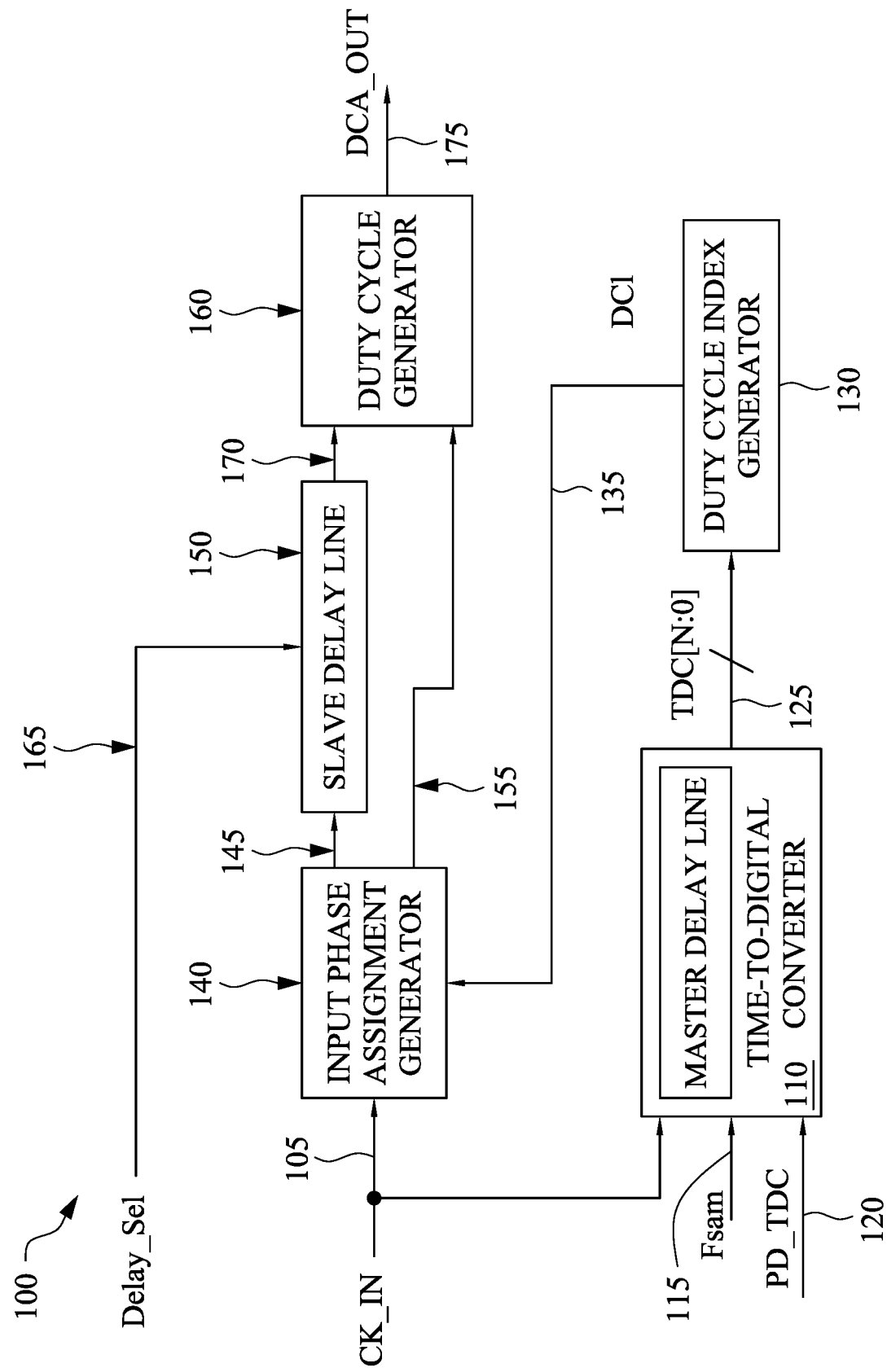
FIG. 1 is an example block diagram of a duty cycle adjustment system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Accurate pulse generation may be critical for proper device operation. For example, for production-level high temperature operating life reliability testing, device degradation induced duty cycle distortion may become a significant issue, particularly in clock signals, thereby reducing speed and eventually causing device failure. To avoid duty cycle distortion, duty cycle adjustment may be performed. Conventionally, duty cycle adjustment has been performed using a charge pump where the duty cycle of an input signal (e.g., clock signal) may be adjusted using feedback control voltage and a ring oscillator. The charge pump has a narrow frequency range, requires a large chip area, has increased power consumption and noise generation, and suffers from poor scaling for process migration. Another conventional mechanism to adjust duty cycle distortion uses a delay line. However, the duty cycle adjustment is limited with the delay line based upon the number of delay stages in the delay line. To support a wide range of duty cycle adjustment, the delay line requires a large number of delay stages, which increases the overall chip area and increases power consumption and noise generation. Thus, conventional mechanisms to adjust duty cycle of an input signal (e.g., clock signal) suffer from various disadvantages.

The present disclosure provides a duty cycle adjustment system having a wide range of duty cycle adjustment using fewer number of delay stages, lower power consumption, improved frequency, reduced chip area, lower noise, and improved technology scaling due to a digital design.

Referring now to FIG. 1, an example block diagram of a duty cycle adjustment system 100 is shown, in accordance with some embodiments of the present disclosure. The duty cycle adjustment system 100 may be used to adjust the duty cycle of a signal. As used herein, a "signal" may be any time varying voltage, current, or electromagnetic wave that carries information. In some embodiments, the signal may be defined in terms of one or more signal properties such as time period, duty cycle, pulse width, etc. The time period of the signal may be the amount of time required for the signal to complete one full cycle. For example, in some embodiments, the time period of a signal may be the amount of time between a rising edge of the signal and the next rising edge of the signal. In some embodiments, the time period may be the amount of time between a falling edge of a signal and the next falling edge of the signal. In some embodiments, the pulse width of a signal may be the amount of time between a rising edge and the next falling edge of the signal. In other embodiments, the pulse width of the signal may be the amount of time between a falling edge and the next rising edge of the signal. Further, in some embodiments, the duty cycle of a signal may define the "ON" time for the signal. In some embodiments, the duty cycle may be computed by dividing the pulse width by the time period. In some embodiments, the duty cycle may be measured in percentages.

The duty cycle adjustment system 100 may be used to adjust the duty cycle or pulse width of an input signal 105. Although the input signal 105 is shown as being a clock signal, in other embodiments, the duty cycle adjustment system 100 may be used to adjust the duty cycle of non-clock signals as well. In some embodiments, the desired output pulse width or duty cycle of the input signal 105 may be predetermined and programmed within the duty cycle adjustment system 100. In other embodiments, the desired output pulse width or duty cycle of the input signal 105 may be controllable and may be adjusted on-the-fly using the duty cycle adjustment system 100. The duty cycle adjustment system 100 may include a time-to-digital converter 110 to digitally calculate/measure a time period of the input signal 105 and convert the calculated/measured time period into digital (e.g., binary) output for a wide range of pulse width generation and duty cycle correction. Specifically, the time-to-digital converter 110 may be configured to determine the time period of the input signal 105 using a sampling clock signal 115 and another sampling signal 120 to generate time-to-digital codes 125. The time-to-digital converter 110 is discussed in greater detail in FIGS. 2-4.

The time-to-digital codes 125 are input into a duty cycle index generator 130 that generates a duty cycle index 135 based upon a computed duty cycle of the input signal 105. The duty cycle index generator 130 computes the duty cycle of the input signal 105 based upon the time-to-digital codes 125. The duty cycle index generator 130 is discussed in greater detail in FIG. 5 below. In some embodiments, the duty cycle index 135 may be a two-bit value that is input into an input phase assignment generator 140. The input phase assignment generator 140 may assign an input clock phase to the input signal 105 based upon the duty cycle index 135 and transmit an output 145 to a slave delay line 150 and an output 155 to a duty cycle generator 160. The slave delay line 150 may delay the output 145 by a predetermined number of delay stages, as determined by a delay selection signal 165 to transmit output 170 to the duty cycle generator 160. The duty cycle generator 160 receives the output 155 from the input phase assignment generator 140 and the output 170 from the slave delay line 150 to adjust the duty cycle of the input signal 105. An output 175 from the duty cycle generator 160 corresponds to the input signal 105 but with an adjusted duty cycle. The input phase assignment generator 140, the slave delay line 150, and the duty cycle generator 160 are discussed in greater detail in FIGS. 6-8 below.

Figure 2:
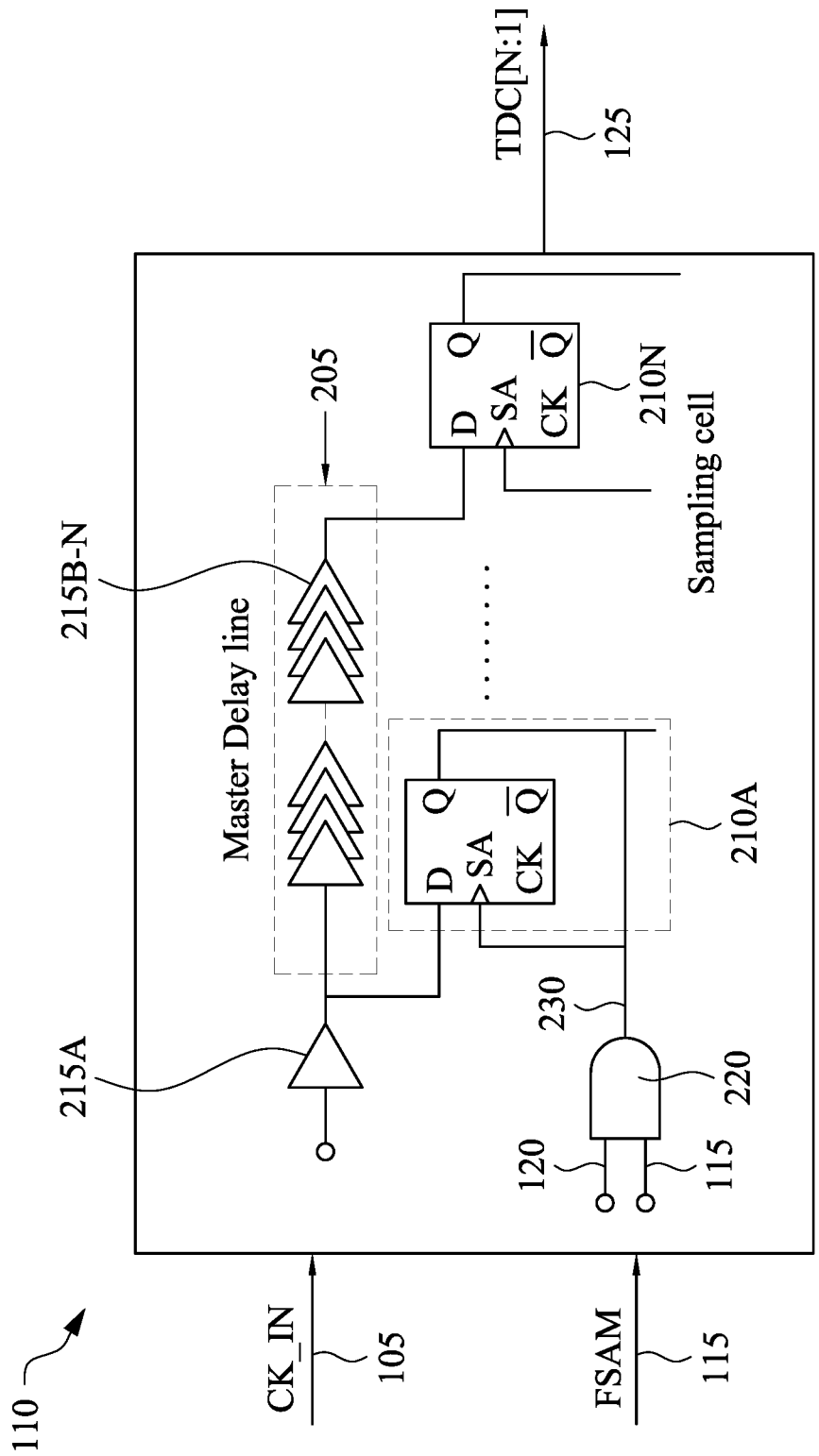
FIG. 2 is an example block diagram of a time-to-digital converter of the duty cycle adjustment system of FIG. 1, in accordance with some embodiments.

Turning to FIG. 2, additional details of the time-to-digital converter 110 are shown, in accordance with some embodiments of the present disclosure. The time-to-digital converter 110 may be used to accurately measure the time period and duty cycle of the input signal 105. Although the time-to-digital converter 110 is used herein, in other embodiments, other circuits or components that allow measuring the time period/duty cycle of the input signal 105 may be used. The time-to-digital converter 110 may be implemented in software, hardware, firmware, or combinations thereof.

Figure 3:
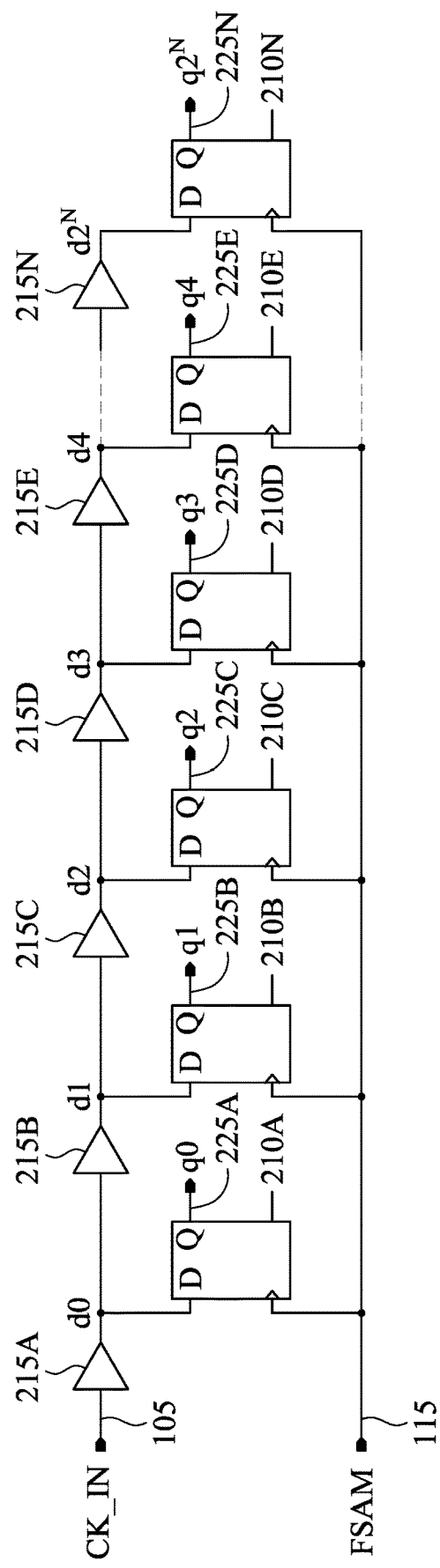
FIG. 3 is an example block diagram showing additional details of the time-to-digital converter of FIG. 2, in accordance with some embodiments.

The time-to-digital converter 110 includes a master delay line 205 and a plurality of sampling cells 210A-210N. Additional details showing how the master delay line 205 is connected to the plurality of sampling cells 210A-210N is shown in FIG. 3. Referring to FIGS. 2 and 3 together, the master delay line 205 includes a plurality of buffers 215A-215N, each of the plurality of buffers forming one delay stage. The number of the plurality of buffers 215A-215N may vary from one embodiment to another depending upon the number of delay stages desired. In some embodiments, each buffer of the plurality of buffers 215A-215N may be associated with one sampling cell from the plurality of sampling cells 210A-210N. Thus, in some embodiments, the number of buffers in the plurality of buffers 215A-215N may be same as the number of sampling cells in the plurality of sampling cells 210A-210N. In other embodiments, the number of buffers in the plurality of buffers 215A-215N may vary from the number of sampling cells in the plurality of sampling cells 210A-210N.

In operation, the first one of the plurality of buffers 215A-215N (e.g., the buffer 215A) receives the input signal 105 as input into the buffer. The output from the buffer 215A is delayed by the propagation time needed by the input signal 105 to propagate through the buffer. Thus, each of the plurality of buffers 215A-215N may have a pre-defined delay time. In some embodiments, each of the plurality of buffers 215A-215N may have the same designed delay time. In other embodiments, one or more of the plurality of buffers 215A-215N may have varying designated delay times. Therefore, the output from the buffer 215A is delayed by a delay amount (e.g., the delay time associated with the buffer 215A). Further, the output from the buffer 215A is input into the buffer 215B. The buffers 215B further delays the input signal 105 and sends the output as input into the buffer 215C, and so on. Thus, each buffer of the plurality of buffers 215B-215N receives the output from the buffer of the immediately previous delay stage as input and delays the input signal further.

Additionally, the output from each of the plurality of buffers 215A-215N is input into a corresponding one of the plurality of sampling cells 210A-210B. Each of the plurality of sampling cells 210A-210N senses the output from its respective one of the plurality of buffers 215A-215N based on a sampling frequency of the sampling clock signal 115. For example, each of the plurality of sampling cells 210A-210N may sample the output of the corresponding one of the plurality of buffers 215A-215N upon a rising edge (or falling edge) of the sampling clock signal 115. In some embodiments, the sampling clock signal 115 may be input into a logic AND gate 220 along with the sampling signal 120 to generate another sampling signal 230, which may be used to sample the plurality of buffers 215A-215N. In some embodiments, each of the plurality of sampling cells 210A-210N may be a D-flip flop. In other embodiments, one or more of the plurality of sampling cells 210A-210N may be a sense amplifier cell or another type of electronic circuit that is configured to sense and store state information.

Figure 4:
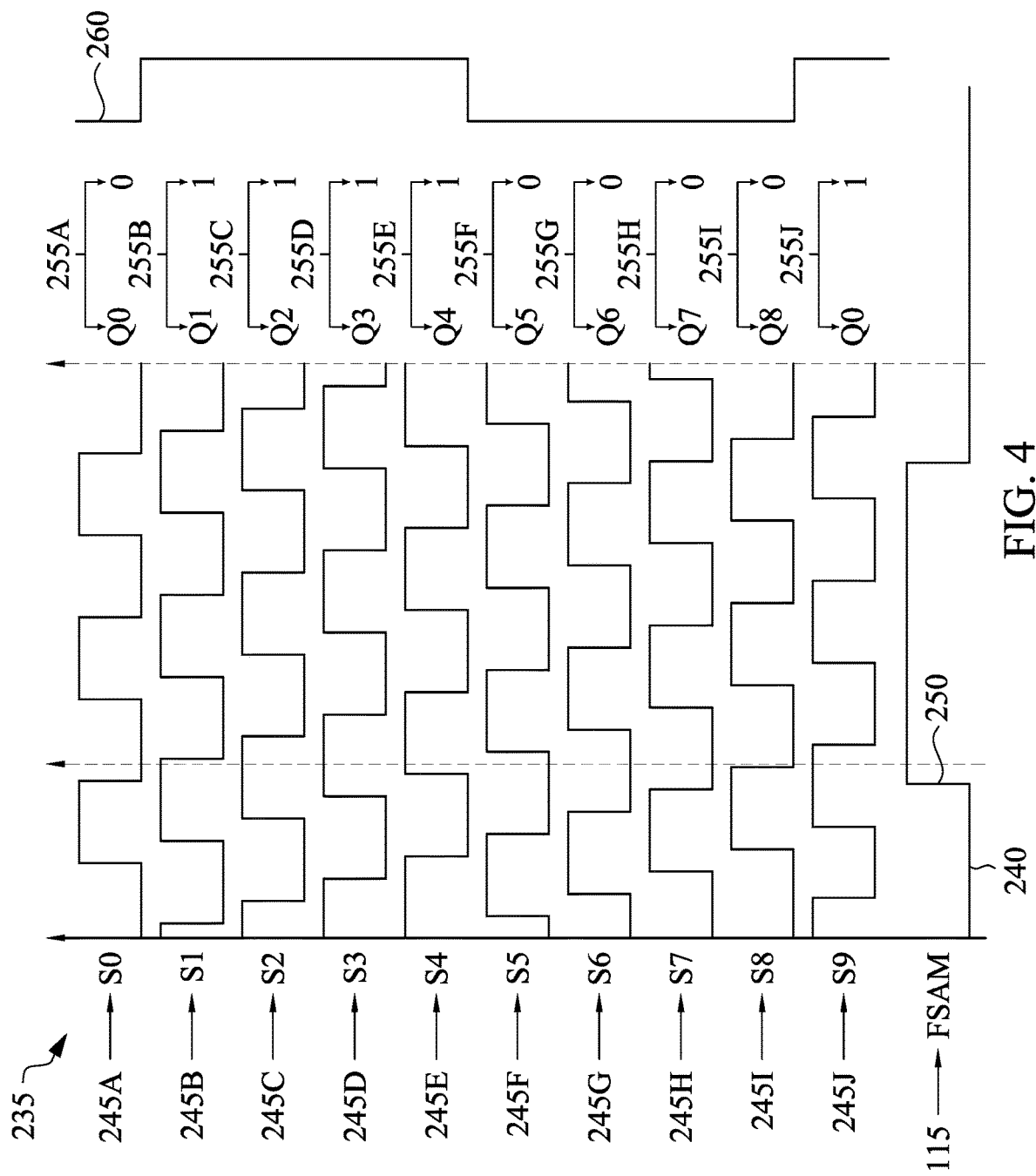
FIG. 4 is an example timing diagram of the time-to-digital converter of FIG. 2, in accordance with some embodiments.

The output from each of the plurality of sampling cells 210A-210N is a time-to-digital code. For example, the sampling cell 210A generates a time-to-digital code 225A, the sampling cell 210B generates a time-to-digital code 225B, and so on. Thus, for N number of the plurality of sampling cells 210A-210N, N time-to-digital codes 225A-225N may be generated by the time-to-digital converter 110. Since each of the N time-to-digital codes 225A-225N is based on an output from one of the plurality of buffers 215A-215N, each of the N time-to-digital codes represents one delay stage. The combination of the N time-to-digital codes is represented herein as the time-to-digital codes 125. An example of the time-to-digital codes 225A-225N generated by the time-to-digital converter 110 is shown in FIG. 4. Thus, referring to FIG. 4 in conjunction with FIGS. 2 and 3, a timing diagram array 235 is shown, in accordance with some embodiments of the present disclosure. The timing diagram array 235 shows a timing diagram 240 of the sampling clock signal 115 and timing diagrams 245A-245J of some of the plurality of sampling cells 210A-210N. For example, the timing diagram 245A may correspond to the timing diagram produced by the sampling cell 210A, the timing diagram 245B may correspond to the timing diagram generated by the sampling cell 210B, and so on.

In some embodiments and as shown in FIG. 4, a rising edge 250 of the sampling clock signal 115 may be used as a trigger for sampling the states of each delay stage of the master delay line 205 and capturing those states using the plurality of sampling cells 210A-210N. Thus, at the rising edge 250, the states of the plurality of sampling cells 210A-210N may be captured from the timing diagrams 245A-245J and the captured states may be output as time-to-digital codes 255A-255J. For example, at the rising edge 250 of the sampling clock signal 115, the timing diagram 245A of the sampling cell 210A is at a low logic level ("0"). Thus, the time-to-digital code 255A captured from the sampling cell 210A at the rising edge 250 is "0." Similarly, at the rising edge 250, each of the timing diagrams 245B-245E and 245J is at a high logic level ("1"). Therefore, each of the time-to-digital codes 255B-255E and 255J is "1." Similarly, at the rising edge 250, each of the timing diagrams 245F-245I is at a low logic level. Therefore, each of the time-to-digital codes 255F-255I is "0." The time-to-digital codes 255A-255J may be output from the time-to-digital converter 110 and input into the duty cycle index generator 130. The time-to-digital codes 255A-255J may be representative of a signal 260, additional details of which are discussed in FIG. 5 below.

Figure 5:
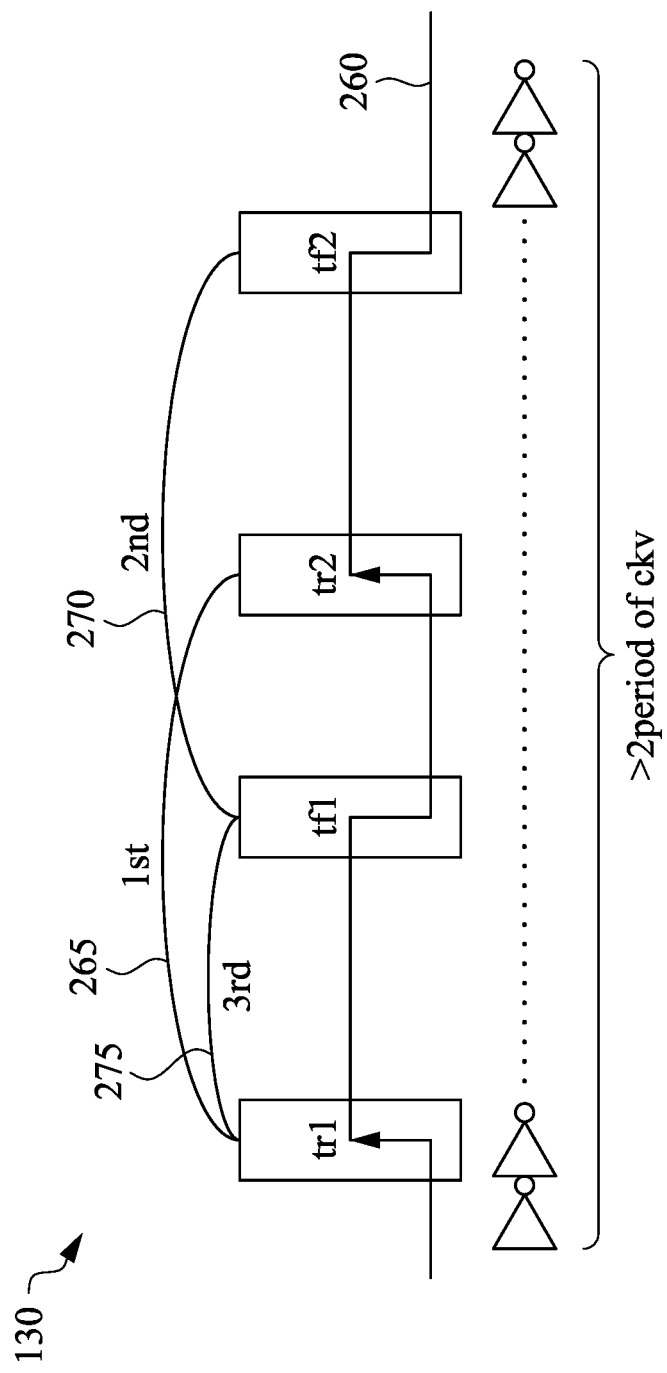
FIG. 5 is an example block diagram explaining how a duty cycle index generator of the duty cycle adjustment system of FIG. 1 calculates a duty cycle of an input signal, in accordance with some embodiments.

Turning now to FIG. 5, additional details of the duty cycle index generator 130 are shown, in accordance with some embodiments of the present disclosure. The duty cycle index generator 130 receives the time-to-digital codes 225A-225N, and generates a duty cycle index therefrom. The duty cycle index represents the computed duty cycle of the input signal 105. To determine the computed duty cycle, the duty cycle index generator 130 identifies the falling and rising edges of the input signal 105 from the time-to-digital codes 225A-225N. To identify the falling and rising edges, the duty cycle index generator 130 may count a number of continuous "0" values and continuous "1" values in the time-to-digital codes 225A-225N, as well as count a number of adjacent "0" and "1" values.

In some embodiments, a "1" value of the time-to-digital codes 225A-225N may indicate that the input signal is at a logic high level, while a "0" may indicate that the input signal is at a logic low level. An adjacent "0" and "1" value may indicate a transition between a rising edge and a falling edge. For example, in some embodiments, the transition from a "0" value to a "1" value may indicate a rising edge, while a transition from a "1" value to a "0" value may indicate a falling edge. For example, in FIG. 5, the signal 260 includes a first rising edge, tr1 and a second rising edge, tr2. The signal 260 also includes a first falling edge, tf1, and a second falling edge, tf2. As shown in FIG. 4, the duration between tr1 and tf1 may be represented by the time-to-digital codes 255B-255E having a value "1," the duration between tf1 and tr2 may be represented by the time-to-digital codes 255F-255I, the rising edge, tr1, may be represented by the transition from the "0" value of the time-to-digital code 255A to the "1" value of the time-to-digital code 255B, the falling edge, tf1, may be represented by the transition from the "1" value of the time-to-digital code 255E to the "0" value of the time-to-digital code 255F, and so on. Thus, by identifying continuous "0" and "1" values, as well as by identifying the transitions between "0" and "1" values, the duty cycle index generator 130 may compute a duty cycle.

Specifically, the duty cycle index generator 130 may first calculate a delay stage number of a repeated period, $S_{period}$ using the following formula:

$$S_{period}=S[tr2]-S[tr1]$$

or $$S_{period}=S[tf1]-S[tf2]$$

Thus, the duty cycle index generator 130 determines the time period of the signal 260 by counting the number of delay stages between two continuous rising edges or two continuous falling edges. For example, in FIG. 5, duration 265 may be between two continuous rising edges and duration 270 may be between two continuous falling edges. S[tr1], S[tr2], S[tf1], and S[tf2] may represent the delay stage numbers of the time-to-digital codes 255A-255N. Additionally, the duty cycle index generator 130 may compute the delay stage number of a high pulse, $S_{high\_pulse}$ of the signal 260 using the following formula:

$$S_{high\_pulse}=S[tf1]-S[tr1]$$

Thus, $S_{high\_pulse}$ represents the pulse width of the signal 260 and may be determined by counting the number of delay stages between a falling edge and a rising edge of the signal. For example, in FIG. 5, the pulse width of the signal 260 may be represented by a duration 275. Then, the duty cycle of the signal 260 may be computed using the following formula:

$$\text{Duty Cycle}=S_{high\_pulse}/S_{period}$$

In some embodiments, the duty cycle computation above may be converted into a percentage form. Further, based upon the computed duty cycle, a duty cycle index may be generated using the table below:

| | |
|---|---|
| Duty Cycle Index = 00 | Duty Cycle = 50% |
| Duty Cycle Index = 01 | Duty Cycle < 50% |
| Duty Cycle Index = 10 | Duty Cycle > 50% |
| Duty Cycle Index = 11 | Reserved |

Thus, if the computed duty cycle is 50%, the duty cycle index 135 that is output from the duty cycle index generator 130 is 00. If the computed duty cycle is less than 50%, the duty cycle index 135 that is output from the duty cycle index generator 130 is 01, while if the computed duty cycle is greater than 50%, then the duty cycle index of 10 is output from the duty cycle index calculation block. In some embodiments, the duty cycle index 135 of 11 may not be used for pulse width adjustment and may be reserved for other functionality. Thus, in some embodiments, the duty cycle index 135 is a two bit value determined based on the time-to-digital codes 225A-225N. The duty cycle index 135 may be input into the input phase assignment generator 140, which is discussed in greater detail in FIG. 6 below. The duty cycle index generator 130 may be formed from software, hardware, firmware, or combinations thereof.

Figure 6:
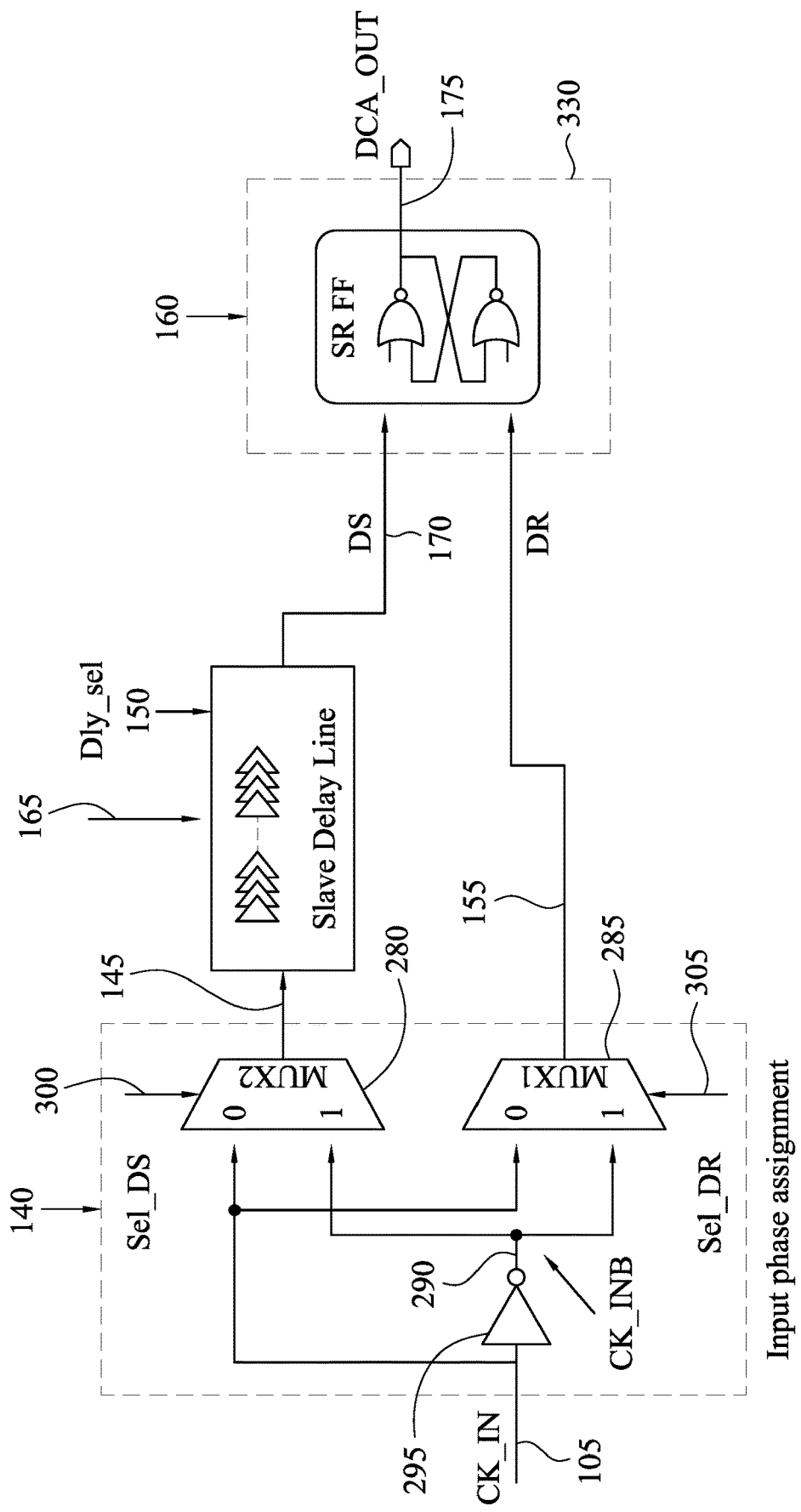
FIG. 6 is an example block diagram of an input phase assignment generator, a slave delay line, and a duty cycle generator of the duty cycle adjustment system of FIG. 1, in accordance with some embodiments.

Referring to FIG. 6, the input phase assignment generator 140 tunes the duty cycle of the input signal 105 using the duty cycle index 135. In some embodiments, the input phase assignment generator 140 includes a first multiplexer 280 and a second multiplexer 285, each of which receives two inputs and generates one output. For example, in some embodiments, each of the first multiplexer 280 and the second multiplexer 285 receives the input signal 105 as the first input and an inverted input signal 290 as the second input. In some embodiments, the input signal 105 may be inverted using an inverter 295. In other embodiments, other mechanisms to invert the input signal 105 may be used to obtain the inverted input signal 290. Further, each of the first multiplexer 280 and the second multiplexer 285 receives a select input 300, 305, respectively, that is based on the duty cycle index 135. Each of the first multiplexer 280 and the second multiplexer 285 may be formed as software, hardware, firmware, or combinations thereof.

When the duty cycle index 135 is 01 indicating a computed duty cycle of less than 50%, in some embodiments, the select input 300 of the first multiplexer 280 is set to 1 (e.g., the right side bit of the duty cycle index 135) and the select input 305 of the second multiplexer 285 is set to 0 (e.g., the left side bit of the duty cycle index 135). Similarly, when the duty cycle index 135 is 10 indicating a computed duty cycle of greater than 50%, the select input 300 of the first multiplexer 280 is set to 0 (e.g., the right side bit of the duty cycle index 135) and the select input 305 of the second multiplexer 285 is set to 1 (e.g., the left side bit of the duty cycle index 135). When set to 1, the first multiplexer 280 selects the inverted input signal 290 as the output 145 and when set to 0, the first multiplexer selects the input signal 105 as the output. Similarly, when set to 0, the second multiplexer 285 selects the input signal 105 as the output 155, while when set to 1, the second multiplexer selects the inverted input signal 290 as the output. The input phase assignment generator 140, thus, receives the input signal 105 and the duty cycle index 135 as input and generates the outputs 145 and 155.

The output 145 from the first multiplexer 280 is input into the slave delay line 150. The output 155 from the second multiplexer 285 is input into the duty cycle generator 160. In some embodiments, the slave delay line 150 may be similar to the master delay line 205. Thus, the slave delay line 150 may include a plurality of buffers, each buffer providing a designated delay time. The output from each buffer may constitute one delay stage. Thus, the slave delay line 150 includes a plurality of delay stages, with each delay stage including a buffer. The first buffer in the slave delay line 150 receives the output 145 from the first multiplexer 280. The output from the first buffer is input into the second buffer of the slave delay line 150, the output from the second buffer is input into the third buffer of the slave delay line 150, and so on. Thus, similar to the plurality of buffers 215A-215N of the master delay line 205, the plurality of buffers of the slave delay line 150 are connected in series.

The number of delay stages, and therefore, the number of buffers in the slave delay line 150 may vary from one embodiment to another. Further, in some embodiments, the number of delay stages in the slave delay line 150 may be the same as the number of delay stages in the master delay line 205. In other embodiments, the number of delay stages in the slave delay line 150 may be different from the number of delay stages in the master delay line 205. Further, the output from the buffer in each delay stage of the slave delay line 150 may be tapped to achieve a different pulse width of the output 145. Specifically, the delay introduced in the output 145 during each delay stage of the slave delay line 150 may be known. Thus, each delay stage may change the duty cycle of the output 145 by a known value, and the number of delay stages needed to achieve the desired pulse width may be determined. Therefore, based upon the number of delay stages needed to attain the desired pulse width of the input signal 105, the output 145 from the slave delay line 150 may be tapped after the output 145 goes through those number of delay stages. The number of delay stages that the output 145 goes through before being tapped may be determined based on the delay selection signal 165. Thus, the tapped output is transmitted from the slave delay line 150 as the output 170.

The output 170 is input into the duty cycle generator 160. In some embodiments, the duty cycle generator 160 includes a set-reset ("SR") flip-flop 330. In some embodiments, the SR flip flop 330 may include cross-coupled NOR gates. In other embodiments, the SR flip flop 330 may include cross-coupled NAND gates or other types of logic gates. In some embodiments, other types of flip flops or other electronic components that achieve the same function as the SR flip flop 330 may be used. In some embodiments, the output 170 from the slave delay line 150 may be provided to the reset input of the SR flip flop 330 and the output 155 from the second multiplexer 285 may be provided to the set input of the SR flip flop. Because the output 170 is selected from a delay stage of the slave delay line 150 to achieve a desired pulse width, the output 175 from the SR flip flop 330 has the desired pulse width, as shown in FIGS. 7 and 8 below, of the input signal 105.

Figure 7:
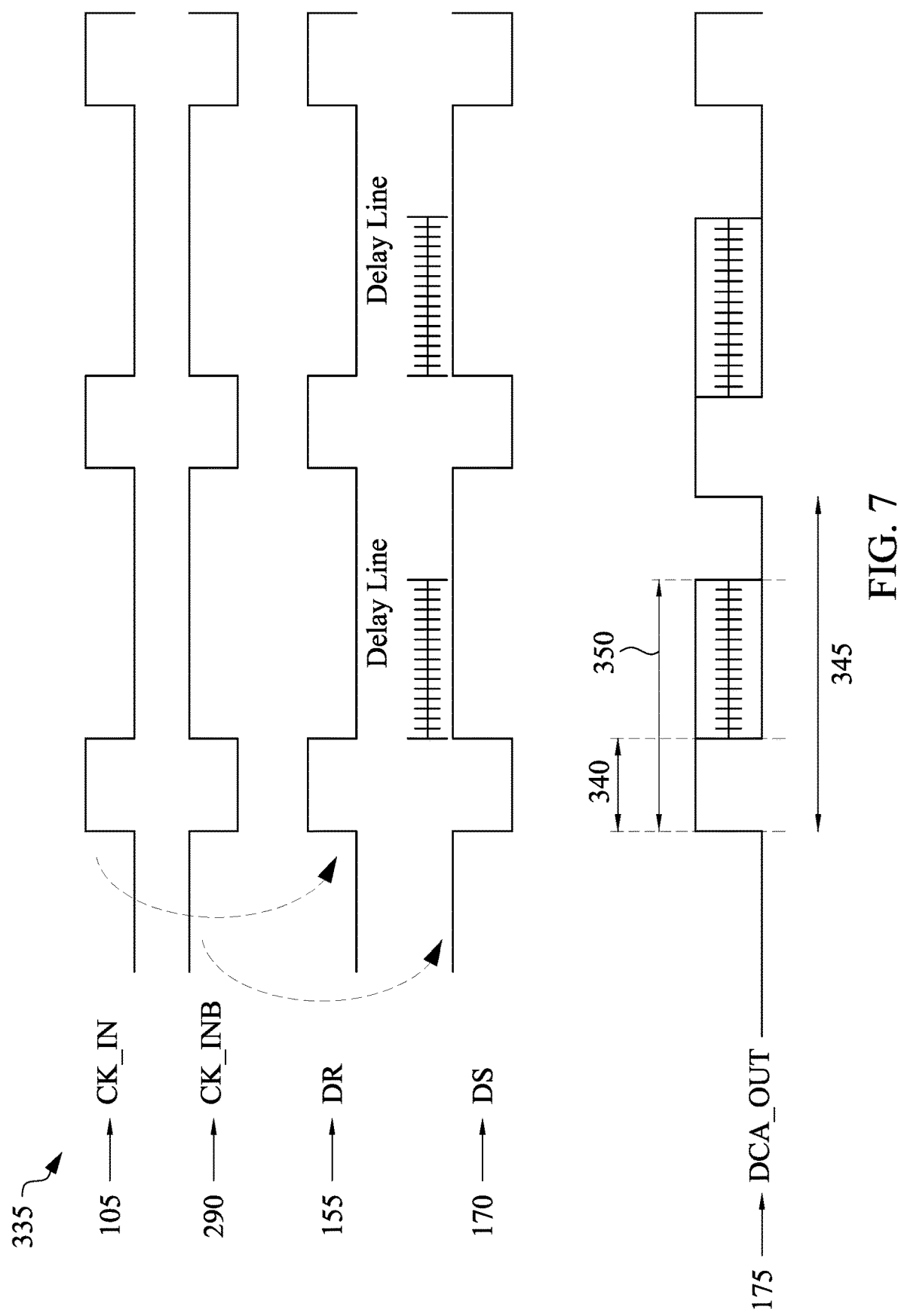
FIG. 7 is an example timing diagram showing duty cycle adjustment, in accordance with some embodiments.
Figure 8:
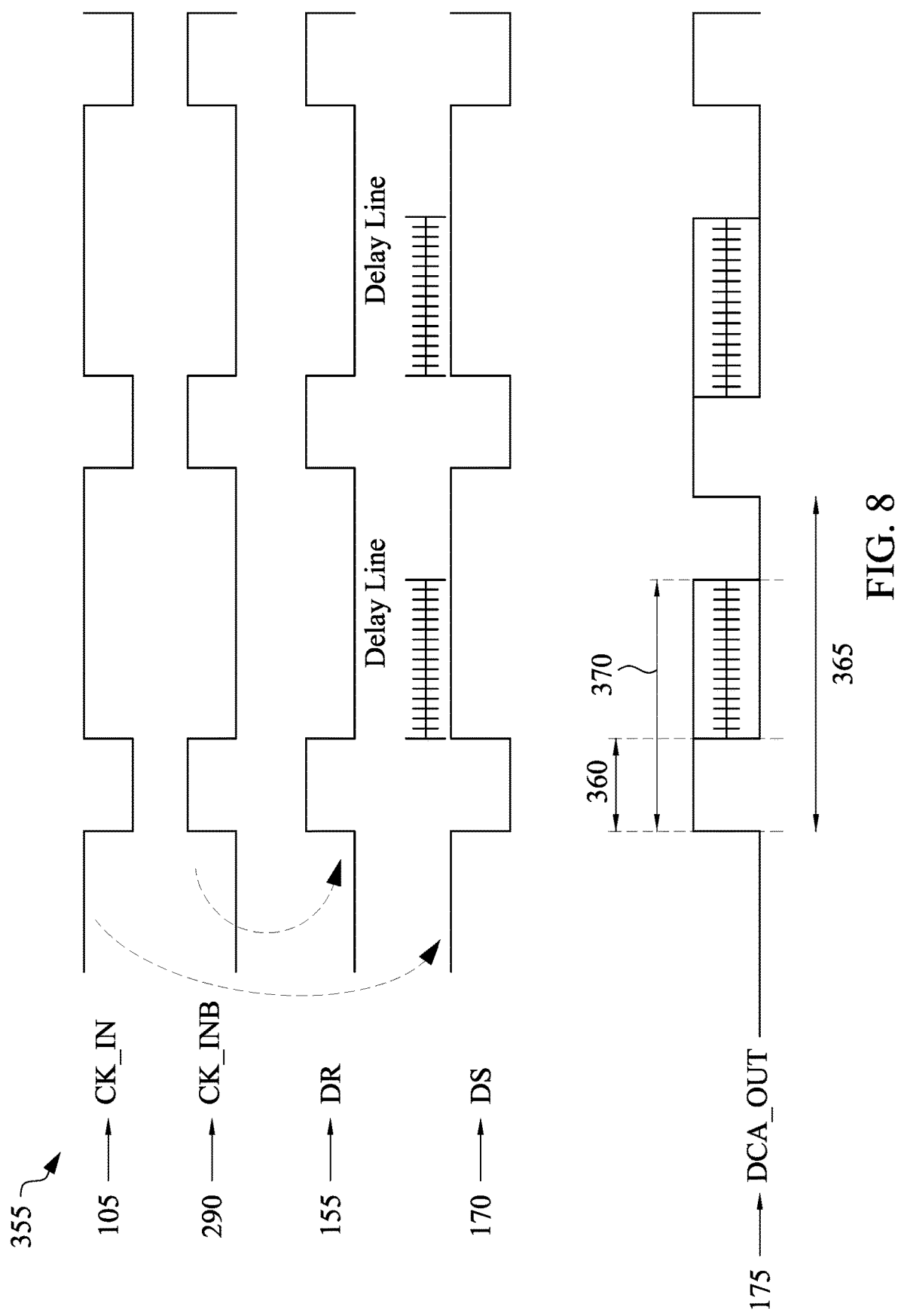
FIG. 8 is another example timing diagram showing duty cycle adjustment, in accordance with some embodiments.

Referring to FIG. 7, an example timing diagram 335 is shown, in accordance with some embodiments of the present disclosure. The timing diagram 335 corresponds to the output 175 achieved when the duty cycle index is 01 indicating a computed duty cycle of the input signal 105 to be less than 50%. The timing diagram 335 includes a timing diagram of the output 155, which is the input signal 105 selected from the second multiplexer 285 and input into the SR flip flop 330. The timing diagram 335 also includes a timing diagram of the output 170, which is the inverted input signal 290 selected as the output 145 from the first multiplexer 280 and passed through the slave delay line 150 before being input into the SR flip flop 330. The output from the SR flip flop 330 is represented by the timing diagram of the output 175.

The duty cycle of the input signal 105 may be adjusted, as shown in the output 175, between a minimum duty cycle and a maximum duty cycle. The minimum duty cycle may be based upon the output 145 that does not go through the slave delay line. In other words, the output 145 from the first multiplexer 280 may be input directly into the SR flip flop 330 similar to the output 155. Thus, the minimum duty cycle may be based upon a pulse width 340, and may be given by the following formula:

$$\text{Duty Cycle}_{min} = T_{delay\_min}/T_{period}$$

In the formula above, $T_{delay\_min}$ is the pulse width 340, while $T_{period}$ is time period 345. Similarly, the maximum duty cycle of the output 175 may be based upon the output tapped from the last delay stage of the slave delay line 150. In other words, the maximum duty cycle may be based upon the maximum delay that can be achieved by the slave delay line 150. The maximum duty cycle may, thus, be given by the following formula:

$$\text{Duty Cycle}_{max} = T_{high\_pulse} + T_{delay\_max}/T_{period}$$

In the formula above, $T_{high\_pulse} + T_{delay\_max}$ is pulse width 350, while $T_{period}$ is the time period 345. Thus, depending upon how much the output 145 is delayed in the slave delay line 150, the output 175 may be adjusted to any duty cycle between the minimum duty cycle in which the output 145 is not delayed at all and the maximum duty cycle in which the output 145 is delayed by the maximum amount in the slave delay line 150. Thus, by using the duty cycle index 135, the input phase assignment generator 140, the slave delay line 150, and the duty cycle generator 160, the duty cycle of the input signal 105 may be adjusted between the minimum duty cycle and the maximum duty cycle as discussed above.

Turning to FIG. 8, an example timing diagram 355 is shown, in accordance with some embodiments of the present disclosure. The timing diagram 355 corresponds to the output 175 achieved when the duty cycle index is 10 indicating a computed duty cycle of the input signal 105 to be greater than 50%. The timing diagram 355 includes a timing diagram of the output 155, which is the inverted input signal 290 selected from the second multiplexer 285 and input into the SR flip flop 330. The timing diagram 355 also includes a timing diagram of the output 170, which is the input signal 105 selected as the output 145 from the first multiplexer 280 and passed through the slave delay line 150 before being input into the SR flip flop 330. The output from the SR flip flop 330 is represented by the timing diagram of the output 175, which reflects the input signal 105 having the adjusted duty cycle.

The duty cycle of the output 175 may be adjusted between a minimum duty cycle and a maximum duty cycle. The minimum duty cycle may be based upon the output 145 that does not go through the slave delay line. In other words, the output 145 from the first multiplexer 280 is input directly into the SR flip flop 330 similar to the output 155. Thus, the minimum duty cycle may be based upon a pulse width 360, and may be given by the following formula:

$$\text{Duty Cycle}_{min} = T_{delay\_min}/T_{period}$$

In the formula above, $T_{delay\_min}$ is the pulse width 360, while $T_{period}$ is time period 365. Similarly, the maximum duty cycle of the output 175 may be based upon the output tapped from the last delay stage of the slave delay line 150. In other words, the maximum duty cycle may be based upon the maximum delay that can be achieved by the slave delay line 150. The maximum duty cycle may, thus, be given by the following formula:

$$\text{Duty Cycle}_{max} = T_{low\_pulse} + T_{delay\_max}/T_{period}$$

In the formula above, $T_{low\_pulse} + T_{delay\_max}$ is pulse width 370, while $T_{period}$ is the time period 365. Thus, depending upon how much the output 145 is delayed in the slave delay line 150, the output 175 may be adjusted to any duty cycle between the minimum duty cycle in which the output 145 is not delayed at all and the maximum duty cycle in which the output 145 is delayed by the maximum amount in the slave delay line 150. Thus, by using the duty cycle index 135, the input phase assignment generator 140, the slave delay line 150, and the duty cycle generator 160, the duty cycle of the input signal 105 may be adjusted between the minimum duty cycle and the maximum duty cycle as discussed above.

Figure 9:
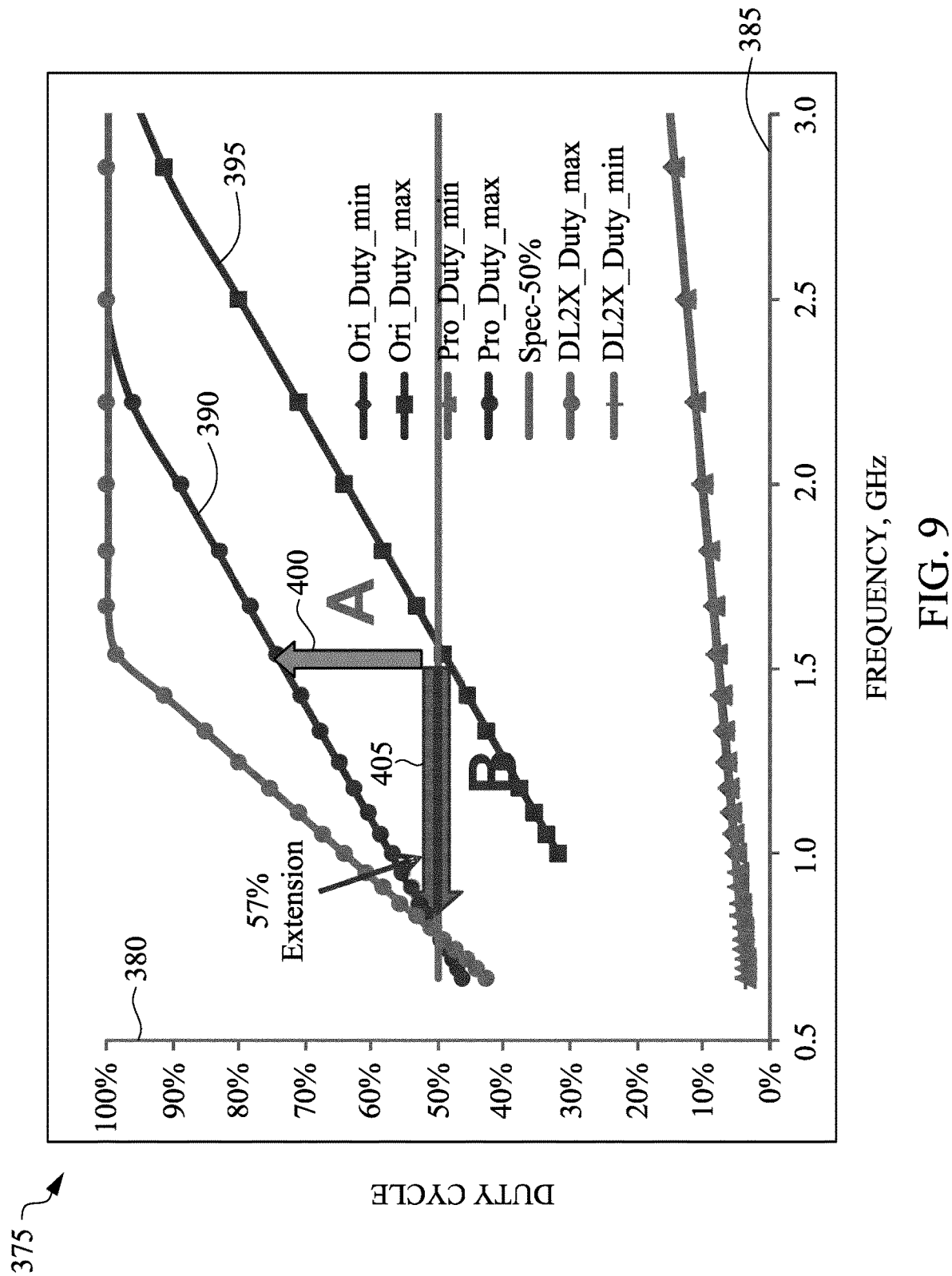
FIGS. 9 and 10 are example graphs showing the advantages of the duty cycle adjustment system of FIG. 1 compared to a conventional duty cycle adjustment mechanism, in accordance with some embodiments.

Turning now to FIG. 9, an example graph 375 is shown, in accordance with some embodiments of the present disclosure. The graph 375 plots duty cycle on Y-axis 380 against frequency on X-axis 385. The graph 375 shows a first plot 390 in which duty cycle adjustment is made according to the present disclosure and a second plot 395 in which duty cycle adjustment is made according to a conventional technique. The graph 375 shows that for a same operation frequency (e.g., at 1.6 GHz), the duty cycle of the first plot 390 is greater than the duty cycle of the second plot 395 (e.g., the duty cycle goes up from about 50% of the second plot to about 75% of the first plot), as shown by arrow 400. Additionally, for the same duty cycle (e.g., 50%), the first plot 390 shows that a lower bound of operation frequency range may be extended to about 57% compared to the frequency of the second plot 395 (e.g., the frequency goes down from about 1.5 GHz of the second plot to about 0.6 GHz of the first plot), as shown by arrow 405.

Figure 10:
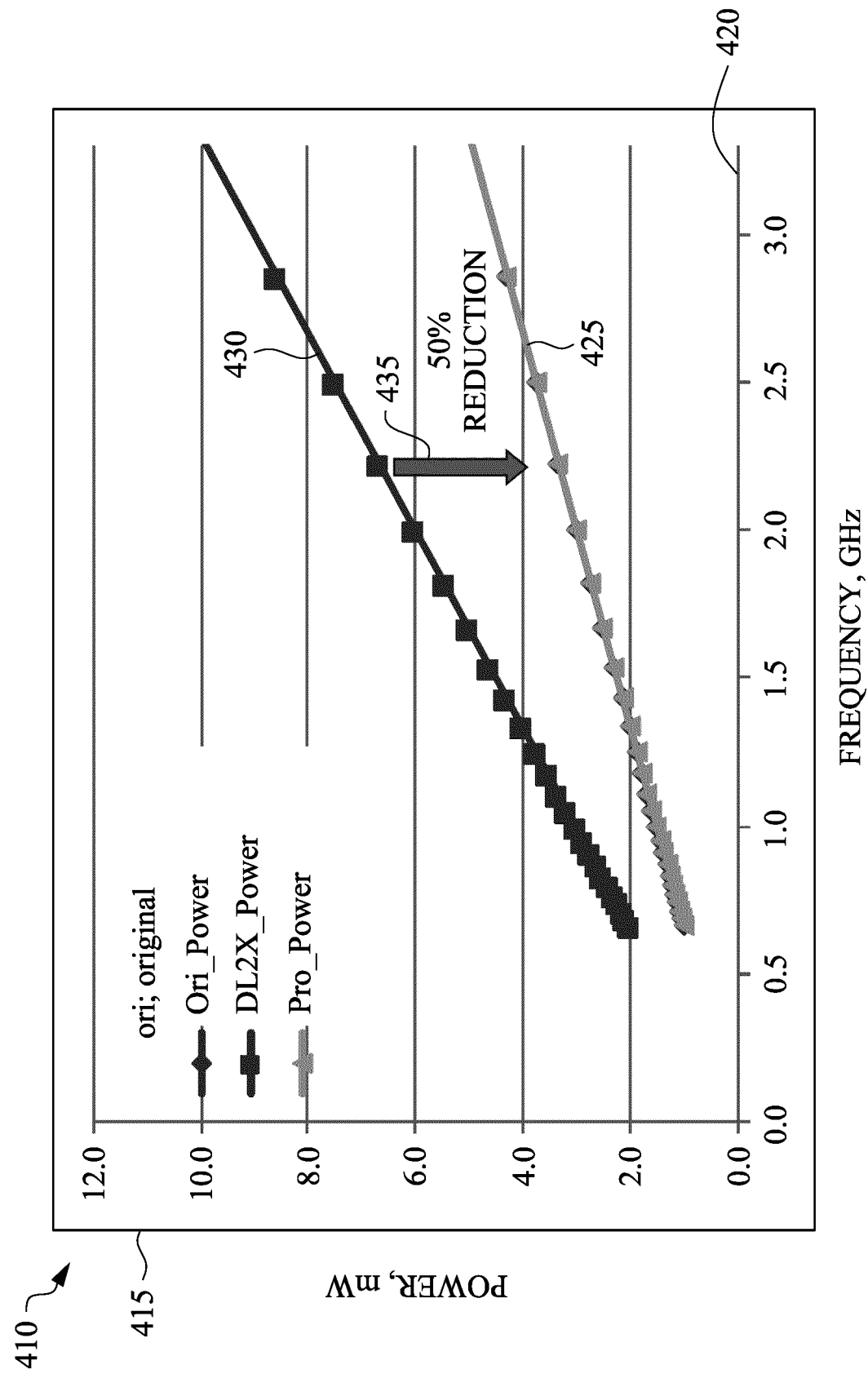

Turning now to FIG. 10, an example graph 410 is shown, in accordance with some embodiments of the present disclosure. The graph 410 plots power consumption on Y-axis 415 against frequency on X-axis 420. The graph 410 shows a first plot 425 in which duty cycle adjustment is made according to the present disclosure and a second plot 430 in which duty cycle adjustment is made according to a conventional technique. The graph 410 shows that for a same operation frequency, the power consumption of the first plot 425 is reduced by about 50% compared to the power consumption of the second plot 430, as shown by arrow 435.

Thus, the present disclosure is able to achieve a wide range operation with low power consumption compared to conventional design approaches. For example, in some embodiments, for the same clock duty cycle, the present disclosure may maintain a same or substantially similar minimum delay (Tdelay_min) as a conventional mechanism, reduce a maximum delay (Tdelay_max) (e.g., in some embodiments, by at least half) of the conventional mechanism, maintain a same or similar frequency (e.g., Frequency_min and Frequency_max) and frequency range (e.g. Frequency_range) as the conventional mechanism, while reducing power consumption by at least half compared to the conventional mechanisms.

Referring now to FIG. 11, an example flowchart outlining operations of a process 440 is shown, in accordance with some embodiments of the present disclosure. The process 440 may be used to adjust the duty cycle of an input signal (e.g., the input signal 105). Thus, at operation 445, the input signal 105 whose duty cycle is to be adjusted is input into the duty cycle adjustment system 100. At operation 450, the input signal 105 is received by the time-to-digital converter 110, which converts time domain information of the input signal into a digital domain. Specifically, the time-to-digital converter 110 may be used to quantize a time interval of the input signal 105 to compute the time period of the input signal based upon a sampling clock signal 115, and output the time-to-digital codes 225A-225N. At operation 455, the time-to-digital codes 225A-225N may be used to compute the duty cycle index 135.

As discussed above, to compute the duty cycle index, the duty cycle index generator 130 first calculates the duty cycle of the input signal 105 using the time-to-digital codes 225A-225N received from the operation 450. To compute the duty cycle of the input signal 105, the duty cycle index generator 130 counts a number of continuous "1" and "0" values indicating a high logic level or a low logic level, respectively, as well as adjacent "1" and "0" values indicating rising or falling edges. Based upon the computed duty cycle, the duty cycle index generator 130 assigns a two bit duty cycle index to the input signal 105. The duty cycle index 135 is input into the input phase assignment generator 140 at operation 460 to assign an input clock phase to the input signal 105 for duty cycle adjustment. Specifically, the input phase assignment generator 140 includes the first multiplexer 280 and the second multiplexer 285, which are controlled based on the duty cycle index 135 to transmit the outputs 145 and 155.

At operation 465, the output 145 from the input phase assignment generator 140 is input into the slave delay line 150 to delay that output by a pre-determined number of stages. The output 170 from the slave delay line 150 is input into the SR flip flop 330. The output 155 is input directly into the SR flip flop 330. The SR flip flop 330 generates the output 175 based on the outputs 155 and 170 having an adjusted duty cycle. The process 440 ends at operation 470.

Thus, the present disclosure provides a digital based mechanism to adjust duty cycle of an input signal over a wide range. The duty cycle adjustment mechanism of the present disclosure achieves a wider range of adjustment than existing mechanisms, at lower power consumption (e.g., high power efficiency), reduced chip area size, and low cost.

In accordance with some aspects of the present disclosure, a duty cycle adjustment system is disclosed. The duty cycle adjustment system includes a time-to-digital converter configured to generate a plurality of time-to-digital codes from an input signal, a duty cycle index generator configured to compute a duty cycle of the input signal based upon the plurality of time-to-digital codes, and assign a duty cycle index based upon the computed duty cycle, and an input phase assignment generator configured to generate a first output and a second output based upon the duty cycle index. The duty cycle adjustment system also includes a first delay line configured to delay the first output to generate a third output and a duty cycle generator configured to adjust the duty cycle of the input signal based upon the third output and the second output.

In accordance with some other aspects of the present disclosure, a method is disclosed. The method includes generating, by a time-to-digital converter of a duty cycle adjustment system, a plurality of time-to-digital codes from an input signal, counting, by a duty cycle index generator of the duty cycle adjustment system, a number of the plurality of time-to-digital codes having continuous 1 values, continuous 0 values, and adjacent 0 and 1 values for computing a duty cycle and assigning a duty cycle index based upon the computed duty cycle, and generating, by an input phase assignment generator a first output and a second output based upon the duty cycle index. The method also includes adjusting, by a duty cycle generator of the duty cycle adjustment system, the duty cycle of the input signal based upon the first output and the second output.

In accordance with yet other aspects of the present disclosure, a circuit is disclosed. The circuit includes a first circuit configured to generate a duty cycle index from an input signal, a first multiplexer configured to receive the input signal as a first input, an inverted input signal as a second input, and a first bit of the duty cycle index as a select input to generate a first output. The first output is the inverted input signal if the duty cycle index is indicative of a computed duty cycle of the input signal being less than a predetermined duty cycle value and the first output is the input signal if the duty cycle index is indicative of the computed duty cycle of the input signal being greater than the predetermined duty cycle value. The circuit also includes a second multiplexer configured to receive the input signal as the first input, the inverted input signal as the second input, and a second bit of the duty cycle index as the select input to generate a second output. The second output is the input signal if the duty cycle index is indicative of the computed duty cycle of the input signal being less than the predetermined duty cycle value and the second output is the inverted input signal if the duty cycle index is indicative of the computed duty cycle of the input signal being greater than the predetermined duty cycle value. The circuit additionally includes a second circuit to adjust a duty cycle of the input signal based upon the first output and the second output.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A duty cycle adjustment system comprising:
a first circuit configured to determine a time period of an input signal;
a second circuit configured to generate a duty cycle index based upon the determined time period;
a third circuit configured to generate a first output and a second output based upon the duty cycle index;
a first delay line configured to delay the first output to generate a third output; and
a fourth circuit configured to adjust the duty cycle of the input signal based upon the second output and the third output.

2. The duty cycle adjustment system of claim 1, wherein the first circuit is configured to generate a plurality of time-to-digital codes indicative of the time period of the input signal.

3. The duty cycle adjustment system of claim 2, wherein the first circuit comprises a time-to-digital converter comprising a second delay line having a plurality of delay stages, and wherein each of the plurality of delay stages generates one of the plurality of time-to-digital codes.

4. The duty cycle adjustment system of claim 3, wherein each of the plurality of delay stages comprises a sampling cell to sample a fourth output from the associated one of the plurality of delay stages based upon a sampling clock signal to generate the plurality of time-to-digital codes.

5. The duty cycle adjustment system of claim 2, wherein the second circuit is configured to count a number of the plurality of time-to-digital codes having continuous 1 values and continuous 0 values, and count the number of the plurality of time-to-digital codes having adjacent 0 and 1 values to determine a computed duty cycle of the input signal, and wherein the second circuit is further configured to generate the duty cycle index based upon the computed duty cycle.

6. The duty cycle adjustment system of claim 5, wherein the duty cycle index is a first predetermined index value if the computed duty cycle is equal to a first predetermined duty cycle value, wherein the duty cycle index is a second predetermined index value if the computed duty cycle is less than a second predetermined duty cycle value, and wherein the duty cycle index is a third predetermined index value if the computed duty cycle is greater than a third predetermined duty cycle value.

7. The duty cycle adjustment system of claim 1, wherein the duty cycle index is a two bit code.

8. The duty cycle adjustment system of claim 1, wherein the third circuit comprises a first multiplexer and a second multiplexer, wherein each of the first multiplexer and the second multiplexer is configured to receive the input signal as a first input and an inverted input signal as a second input.

9. The duty cycle adjustment system of claim 8, wherein the first multiplexer is configured to receive a first portion of the duty cycle index to select the first input or the second input as the first output and the second multiplexer is configured to receive a second portion of the duty cycle index to select the first input or the second input as the second output.

10. The duty cycle adjustment system of claim 8, wherein when the duty cycle index is indicative of a computed duty cycle being less than 50%, the first output is the inverted input signal and the second output is the input signal.

11. The duty cycle adjustment system of claim 8, wherein when the duty cycle index is indicative of a computed duty cycle being greater than 50%, the first output is the input signal and the second output is the inverted input signal.

12. The duty cycle adjustment system of claim 1, wherein the fourth circuit is configured to adjust the duty cycle of the input signal based upon a predetermined number of delay stages that the first output passes through in the first delay line.

13. A method comprising:
determining, by a first circuit of a duty cycle adjustment system, a plurality of time-to-digital codes from an input signal;
determining a duty cycle index, by a second circuit of the duty cycle adjustment system, by counting a number of the plurality of time-to-digital codes having continuous 1 values, continuous 0 values, and adjacent 0 and 1 values; and
adjusting, by a third circuit of the duty cycle adjustment system, the duty cycle of the input signal based upon the duty cycle index.

14. The method of claim 13, further comprising:
generating, by a fourth circuit of the duty cycle adjustment system, a first output and a second output based upon the duty cycle index; and
adjusting, by the third circuit, the duty cycle of the input signal based upon the first output and the second output.

15. The method of claim 14, further comprising:
inputting the input signal as a first input and an inverted input signal as a second input into each of a first multiplexer and a second multiplexer of the fourth circuit;
selecting, by the first multiplexer, the first output based upon a first portion of the duty cycle index; and
selecting, by the second multiplexer, the second output based upon a second portion of the duty cycle index.

16. The method of claim 13, further comprising:
computing, by the second circuit, a computed duty cycle based upon the counting of the plurality of time-to-digital codes; and
generating, by the second circuit, the duty cycle index based upon the computed duty cycle.

17. A circuit comprising:
a first circuit configured to generate a duty cycle index from an input signal;
a first multiplexer configured to receive the input signal as a first input, an inverted input signal as a second input, and generate a first output based upon a first portion of the duty cycle index;
a second multiplexer configured to receive the input signal as a third input, the inverted input signal as a fourth input, and generate a second output based upon a second portion of the duty cycle index; and
a second circuit to adjust a duty cycle of the input signal based upon the first output and the second output.

18. The circuit of claim 17, wherein the first output is the inverted input signal if the first portion of the duty cycle index is indicative of a computed duty cycle of the input signal being less than a predetermined duty cycle value and the first output is the input signal if the first portion of the duty cycle index is indicative of the computed duty cycle of the input signal being greater than the predetermined duty cycle value.

19. The circuit of claim 17, wherein the second output is the input signal if the second portion of the duty cycle index is indicative of a computed duty cycle of the input signal being less than a predetermined duty cycle value and the second output is the inverted input signal if the second portion of the duty cycle index is indicative of the computed duty cycle of the input signal being greater than the predetermined duty cycle value.

20. The circuit of claim 17, further comprising a slave delay line configured to receive the first output and generate a third output, wherein the third output is input into the second circuit along with the second output, wherein the second circuit comprises a set-reset flip flop configured to adjust the duty cycle of the input signal based upon the third output and the second output.

* * * * *